United States Patent
Ko et al.

(10) Patent No.: US 8,569,146 B2
(45) Date of Patent: Oct. 29, 2013

(54) ISOLATION STRUCTURE FOR STRAINED CHANNEL TRANSISTORS

(75) Inventors: Chih-Hsin Ko, Fongshang (TW); Yee-Chia Yeo, Singapore (SG); Wen-Chin Lee, Hsinchu (TW); Chung-Hu Ge, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 123 days.

(21) Appl. No.: 13/013,296

(22) Filed: Jan. 25, 2011

(65) Prior Publication Data

US 2011/0117724 A1    May 19, 2011

Related U.S. Application Data

(60) Division of application No. 11/586,936, filed on Oct. 26, 2006, now abandoned, which is a division of application No. 10/875,141, filed on Jun. 23, 2004, now abandoned, which is a continuation-in-part of application No. 10/423,513, filed on Apr. 25, 2003, now Pat. No. 6,882,025.

(51) Int. Cl.
  *H01L 21/76* (2006.01)
(52) U.S. Cl.
  USPC .................................. 438/425; 438/424
(58) Field of Classification Search
  USPC .................................... 438/424, 425
  See application file for complete search history.

(56) References Cited

U.S. PATENT DOCUMENTS

| | | |
|---|---|---|
| 4,631,803 A | 12/1986 | Hunter et al. |
| 5,225,358 A | 7/1993 | Pasch |
| 5,447,884 A | 9/1995 | Fahey et al. |
| 5,763,315 A | 6/1998 | Benedict et al. |
| 5,869,384 A | 2/1999 | Yu et al. |
| 5,970,363 A | 10/1999 | Kepler et al. |
| 5,989,975 A | 11/1999 | Kuo |
| 5,989,978 A | 11/1999 | Peidous |
| 6,046,487 A | 4/2000 | Benedict et al. |
| 6,228,727 B1 | 5/2001 | Lim et al. |
| 6,291,321 B1 | 9/2001 | Fitzgerald |
| 6,429,061 B1 | 8/2002 | Rim |
| 6,882,025 B2 | 4/2005 | Yeo et al. |
| 6,933,518 B2 | 8/2005 | Braithwaite et al. |
| 6,960,781 B2 | 11/2005 | Currie et al. |
| 2003/0049893 A1 | 3/2003 | Currie et al. |
| 2003/0109111 A1 * | 6/2003 | Hsieh et al. ............ 438/400 |
| 2004/0173812 A1 | 9/2004 | Currie et al. |

OTHER PUBLICATIONS

J. Welser et al., "NMOS and PMOS Transistors Fabricated in Strained Silicon/Relaxed Silicon-Germanium Structures", IEDM 92/1001 (Solid State Electronics Lab., Stanford, CA 94305), pp. 31.7.1-31.7.3.

* cited by examiner

*Primary Examiner* — Allen Parker
(74) *Attorney, Agent, or Firm* — Duane Morris LLP; Steven E. Koffs

(57) ABSTRACT

A method and system is disclosed for forming an improved isolation structure for strained channel transistors. In one example, an isolation structure is formed comprising a trench filled with a nitrogen-containing liner and a gap filler. The nitrogen-containing liner enables the isolation structure to reduce compressive strain contribution to the channel region.

20 Claims, 15 Drawing Sheets

PRIOR ART

PRIOR ART

ISOLATION STRUCTURE FOR STRAINED CHANNEL TRANSISTORS

CROSS-REFERENCE TO RELATED APPLICATIONS

This application is a division of U.S. patent application Ser. No. 11/586,936, filed Oct. 26, 2006, which is a divisional of co-pending U.S. patent application Ser. No. 10/875,141, filed Jun. 23, 2004, which is a continuation in part of U.S. patent application Ser. No. 10/423,513, filed Apr. 25, 2003, now U.S. Pat. No. 6,882,025 to Yeo, the entirety of which are incorporated by reference.

TECHNICAL FIELD

The present disclosure relates generally to the field of semiconductor devices, and more particularly to strained channel transistors with enhanced performance using improved isolation regions and the method for making same.

BACKGROUND

Size reduction of the metal-oxide-semiconductor field-effect transistor (MOSFET), including reduction of the gate length and gate oxide thickness, has enabled the continued improvement in speed performance, density, and cost per unit function of integrated circuits over the past few decades. To enhance transistor performance further, strain may be introduced in the transistor channel for improving carrier mobility. Therefore, strain-induced mobility enhancement is another way to improve transistor performance in addition to device scaling. Several existing approaches of introducing strain in the transistor channel region have been proposed.

There are several existing approaches of introducing strain in the transistor channel region to enhance further transistor performance. In one conventional approach, a relaxed silicon germanium (SiGe) buffer layer 102 is provided beneath the channel region, as shown in FIG. 1(a). The relaxed SiGe buffer layer 102 has a larger lattice constant compared to relaxed Si 104, and a thin layer of epitaxial Si 106 grown on relaxed SiGe 102 will have its lattice stretched in the lateral direction, i.e. it will be under biaxial tensile strain. This is illustrated in FIG. 1(b). Therefore, a transistor formed on the epitaxial strained silicon layer 106 will have a channel region that is under biaxial tensile strain. In this approach, the relaxed SiGe buffer layer 102 can be thought of as a stressor that introduces strain in the channel region. The stressor, in this case, is placed below the transistor channel region. Significant mobility enhancement has been reported for both electrons and holes in bulk transistors using a silicon channel under biaxial tensile strain. In the abovementioned approach, the epitaxial silicon layer 106 is strained before the formation of the transistor. Therefore, there are concerns about possible strain relaxation upon subsequent CMOS processing where high temperatures are used. An example of a high temperature process step in CMOS processing is the formation of an isolation structure, such as shallow trench isolation, to electrically isolate devices from one another.

In a conventional shallow trench isolation structure, as shown in FIG. 2, a silicon oxide liner 204 is typically thermally grown at temperatures ranging from 900 to 1100 degrees Celsius. The high temperatures can potentially cause strain relaxation and reduce the tensile strain in the tensile strained silicon channel region 206. By using the conventional oxide-filled trench isolation structure 208 with the strained silicon substrate 210, as shown in FIG. 2, the trench isolation structure 208 contributes a significant compressive strain component 212 to the channel region 206. The compressive strain component 212 contributed by the oxide-filled trench isolation structure 208 cancels out a portion of the tensile strain component of the tensile strained silicon substrate 210 constituting the channel region 206. With the reduction of the tensile strain in the channel region 206 of the transistor, the strain-induced performance enhancement is reduced significantly. The compressive strain results from sidewall oxidation and volume expansion of the silicon oxide material in the trench.

What is needed is an improved isolation structure for strained channel transistors and the method for making same.

SUMMARY OF INVENTION

In view of the foregoing, the present disclosure provides a system and method for forming an improved isolation structure for strained channel transistors.

In one example, an isolation structure is formed comprising a trench filled with a silicon oxide liner, a nitrogen-containing liner, and a gap filler. In another example, an isolation structure is formed comprising a trench filled with a nitrogen-containing liner and a gap filler. The nitrogen-containing liner enables the isolation structure to reduce compressive strain contribution to the channel region. The nitrogen-containing liner minimizes confined volume expansion and reduces compressive stress in the surrounding active region.

The present disclosure provide isolation structures with reduced compressive strain contribution and reduced thermal budget in a tensile strained silicon substrate. Another object of the present disclosure is to teach a method of engineering the strain in the channel of the tensile strained transistor by engineering the isolation structure to improve transistor performance.

These and other aspects and advantages will become apparent from the following detailed description, taken in conjunction with the accompanying drawings, illustrating by way of example the principles of the disclosure.

BRIEF DESCRIPTION OF DRAWINGS

The present disclosure will be more clearly understood after reference to the following detailed description of preferred embodiments read in conjunction with the drawings, wherein.

DETAILED DESCRIPTION OF PREFERRED EMBODIMENTS

As illustrated below, the structure of and methods are disclosed below for the manufacture of an improved isolation structure with reduced compression strain contribution to the channel region and/or reduced thermal budget. Several embodiments are shown as illustrated examples.

First Embodiment

Figure 1A:
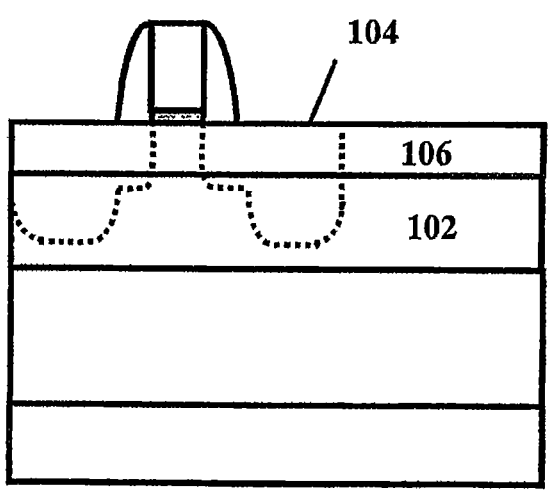
FIGS. 1(a)-(b) illustrate the cross-section of a conventional strained silicon transistor with a relaxed SiGe and the illustration of the origin of strain in the Si/SiGe hetero-structure, respectively.
Figure 1B:
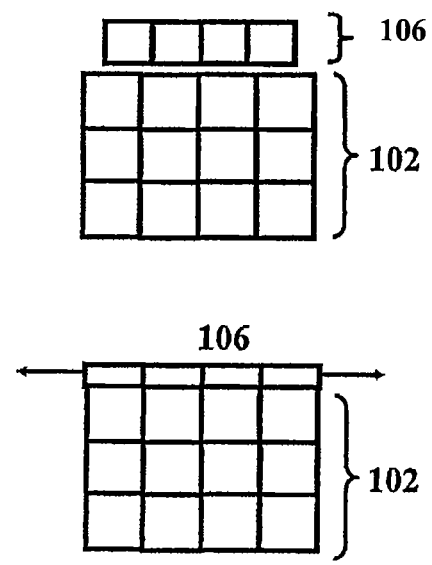
Figure 2:
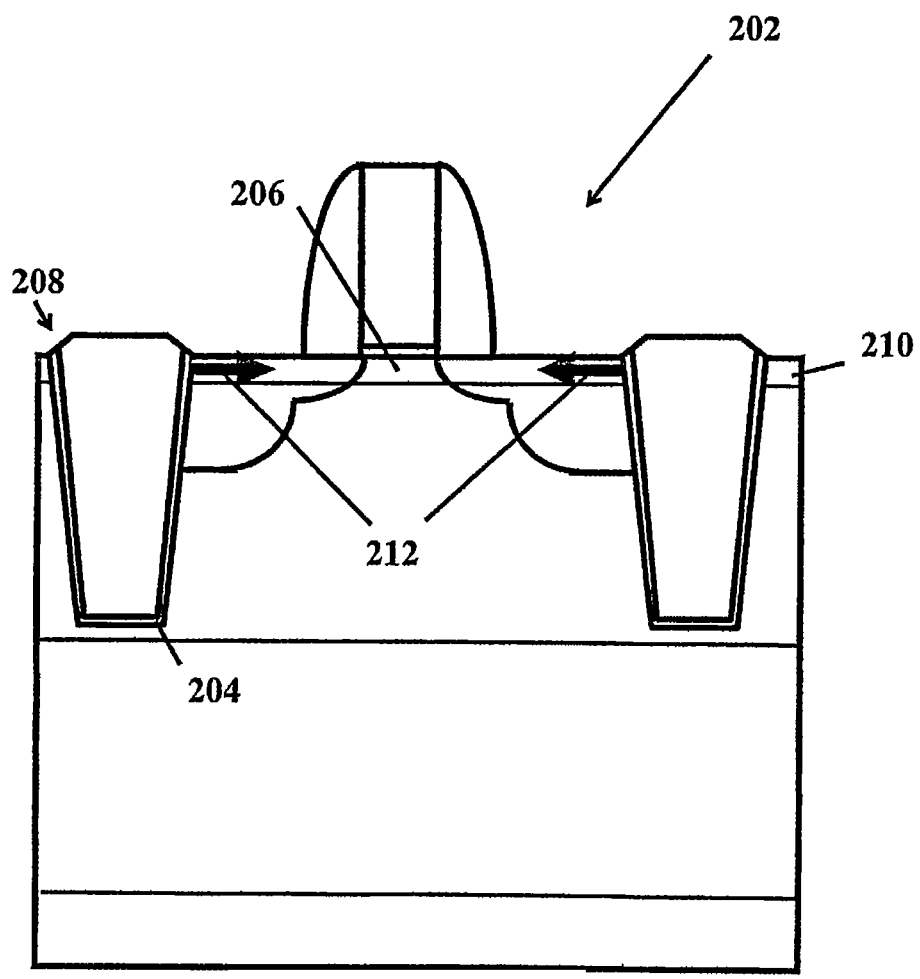
FIG. 2 illustrates a transistor formed in an active region isolated shallow trench isolation (STI).
Figure 3A:
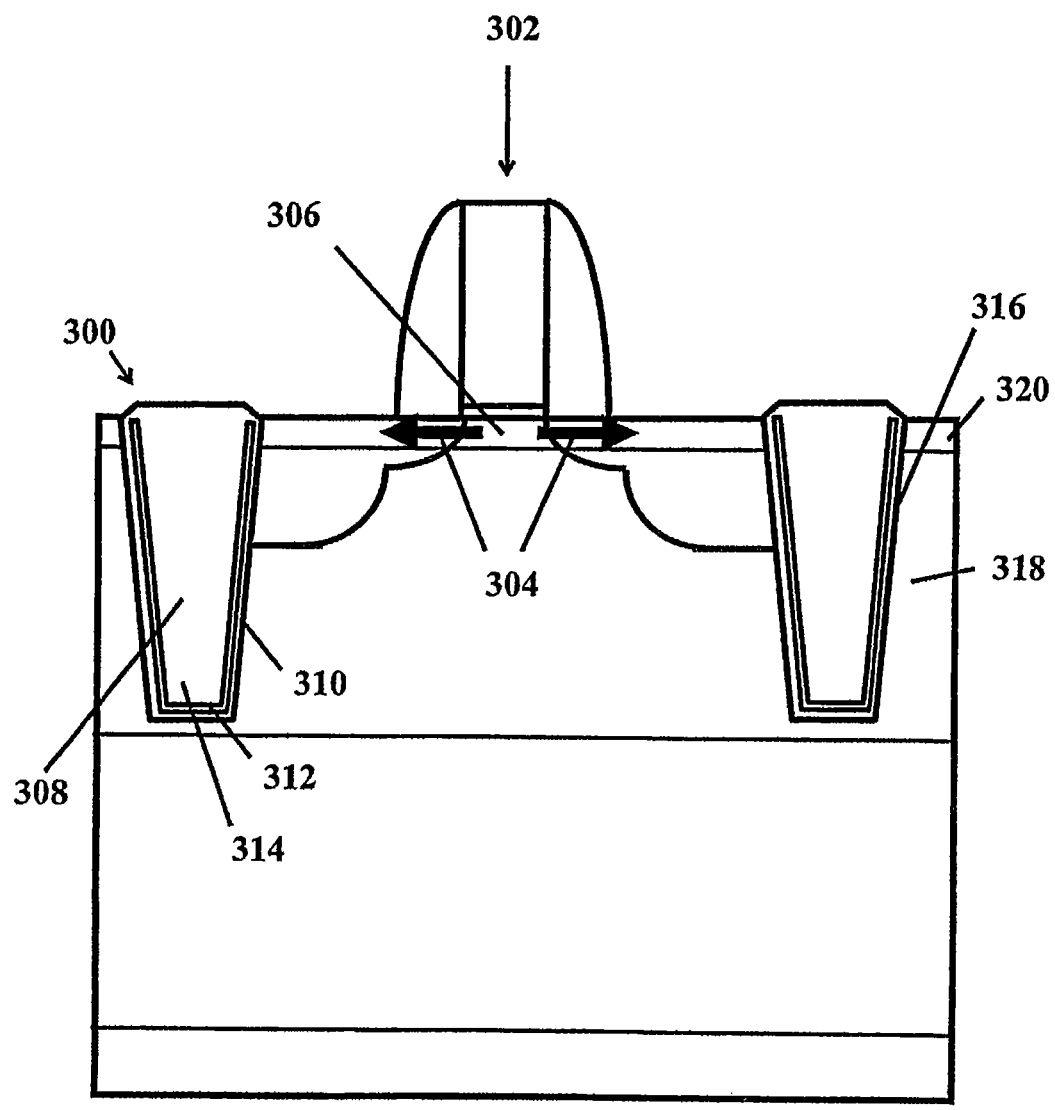
FIGS. 3(a)-(b) illustrate a novel low-stress isolation structure for the strained silicon transistor according to one example of the present disclosure.

FIG. 3(a) illustrates a first structure embodiment of the present disclosure. The isolation structure 300 for the strained silicon transistor 302 enables the high tensile strain components 304 in the channel region 306, indicated by the solid arrows, to be maintained. The isolation structure 300 illustrated in FIG. 3(a) comprises a trench 308 filled with a silicon oxide liner 310, a nitrogen-containing liner 312, and a gap filler 314. The depth of the trench 308 is in the range of 2000 to 6000 angstroms. The nitrogen-containing liner 312 contributes to the reduction of compressive strain contribution to the channel region 306. The nitrogen-containing liner 312 acts as an oxidation mask, preventing further oxidation of the trench sidewalls 316 in subsequent processing steps where, because of its slow diffusion rate in the nitrogen-containing liner 312, oxygen is present in the processing ambient. The nitrogen-containing liner 312 minimizes confined volume expansion and reduces compressive stress in the surrounding active region. Prior art tensile strained silicon transistors do not employ the nitrogen-containing liner 312 and as a result have reduced tensile strain and compromised transistor performance. According to one preferred embodiment of this disclosure, the nitrogen-containing liner 312 is comprised of silicon nitride, $Si_3N_4$. The nitrogen-containing liner 312 may also be comprised of a silicon oxynitride $SiO_xN_y$ material or a nitrogen-doped silicon oxide material, where the atomic percentage of nitrogen in the nitrogen-containing liner 312 may be in the range of 5 to 60 percent (%). It is understood, however, that other materials with oxygen diffusion rates lower than that of silicon oxide may be used. By employing an isolation structure 300 with a nitrogen-containing liner 312, the compressive strain contribution by the isolation structure 300 to the channel region 306 is reduced, so that the channel region 306 is entirely or almost entirely strained by the relaxed silicon-germanium (SiGe) layer 318 underlying the channel region 306. The present embodiment provides a strained silicon layer 320 totally tensile strained by the underlying relaxed SiGe layer 318 and can be negligibly compressive-strained by the isolation structure 300.

Second Embodiment

Figure 3B:
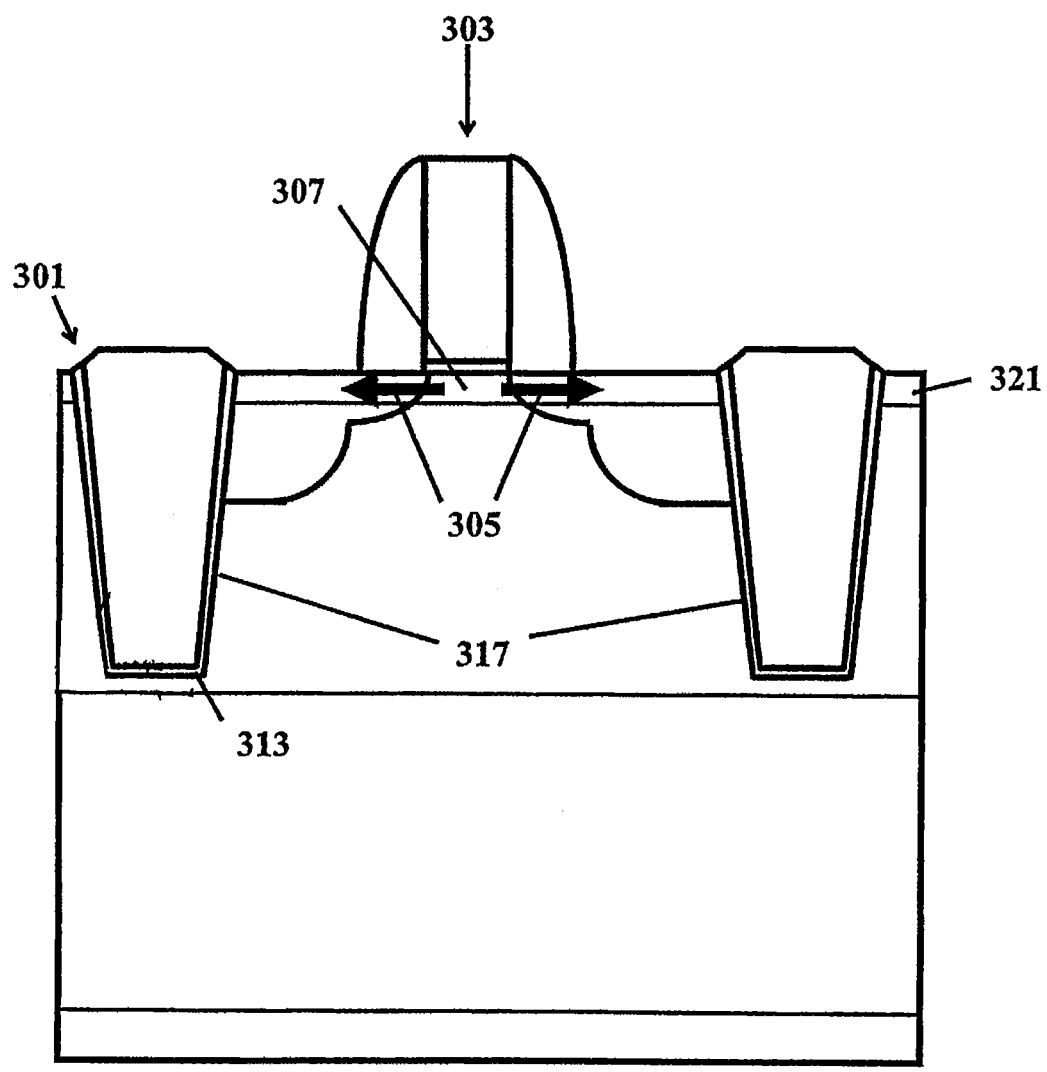

FIG. 3(b) illustrates a second structure embodiment of the present disclosure. The second structure embodiment of FIG. 3(b) differs from the first structure embodiment described above and illustrated in FIG. 3(a) in that the nitrogen-containing liner 313 in FIG. 3(b) is in direct contact with the trench sidewall surface 317. In other words, the silicon oxide liner 310 of the first embodiment in FIG. 3(a) is not used in this embodiment. By eliminating the silicon oxide liner 310, this structure further reduces the thermal budget associated with the isolation structure 301 formation process and further improves the ability of the nitrogen-containing liner 313 to block oxidation of the trench sidewall surface 317. In addition, it is also possible that the nitrogen-containing liner 313 may exert a beneficial strain on the channel region 307. For example, the nitrogen-containing liner 313 itself may be formed under tensile stress, and therefore induces a vertical compressive strain on the region of the strained silicon layer 321 in its immediate vicinity. This vertical compressive strain provides an additional biaxial tensile strain component to the channel region 307. Therefore, the preferred embodiment of FIG. 3(b) reduces the compressive strain contribution by the isolation structure 301 on the channel region 307 and potentially could strengthen the in-plane tensile strain component 305 that is beneficial to the strained channel transistor 303 for additional boost in speed performance.

Third Embodiment

Figure 4A:
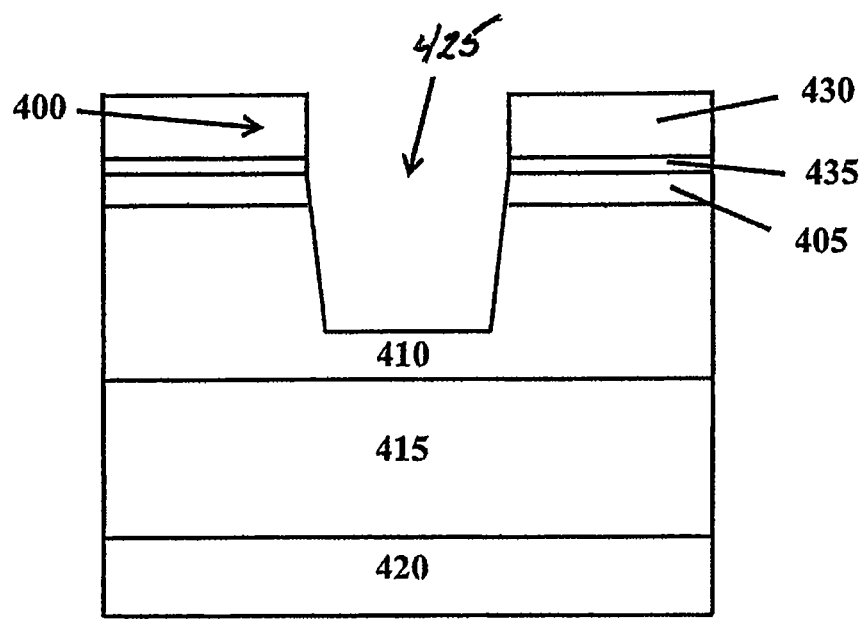
FIGS. 4(a)-(e) illustrate a first method of manufacturing a novel low-stress isolation structure for the strained silicon transistor according to another example of the present disclosure.

FIGS. 4(a)-(e) illustrate a first method embodiment of the present disclosure, describing a process flow for forming strained silicon transistors with reduced thermal budget and reduced compressive strain contribution by the isolation structure to the channel region. The isolation structure 400 preferably comprises a nitrogen-containing liner 440 in direct contact with the trench sidewall surface 445. The nitrogen-containing liner 440 can be a single silicon nitride layer or a silicon oxynitride layer. The nitrogen content of the nitrogen-containing liner 440 may be in the range of 5 to 60 percent (%) by atomic percentage. A substrate comprising a strained silicon layer 405 (FIG. 4e) overlying a relaxed silicon-germanium (SiGe) layer 410 is used as the starting material. Such a substrate may further comprise a graded SiGe buffer layer 415, and may further comprise a silicon substrate 420 underlying the graded SiGe buffer layer 415. A first patterned mask is formed on the substrate, and the trenches 425 are etched into the substrate, as shown in FIG. 4(a). The first patterned mask is preferably comprised of a silicon nitride layer 430 overlying a pad oxide layer 435. The pad oxide layer 435 is preferably comprised of silicon oxide. A conventional anisotropic plasma etching with fluorine chemistry is used to etch the isolation trenches 425.

Figure 4B:
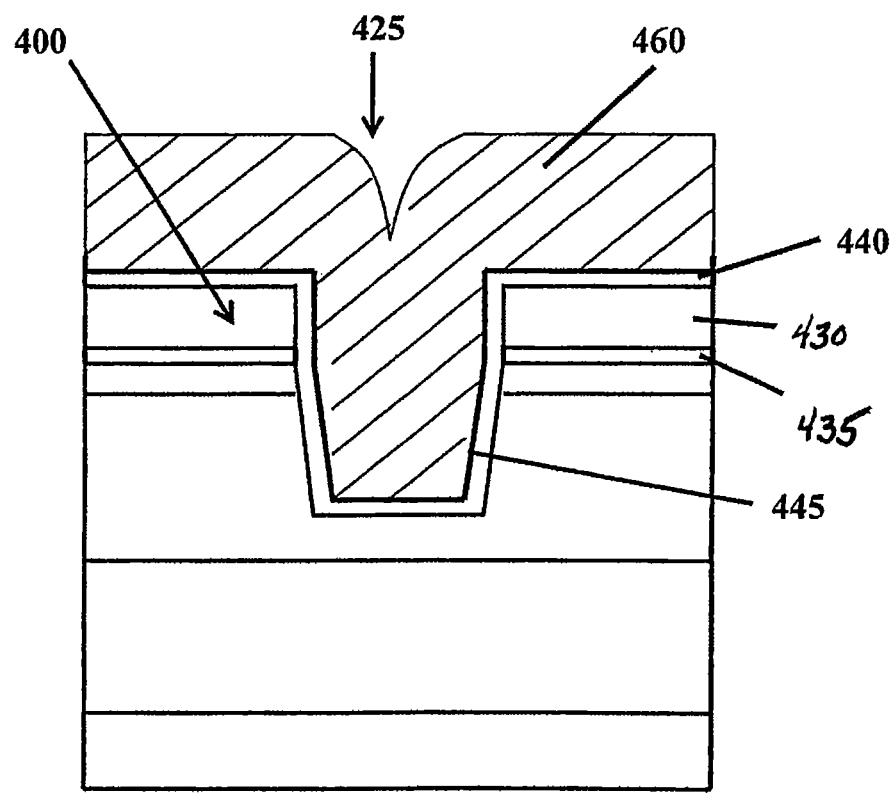

FIG. 4(b) illustrates the formation of a nitrogen-containing liner 440 in the isolation structure. The nitrogen-containing liner 440 may be formed by low-pressure chemical vapor deposition (LPCVD), for example. The nitrogen-containing liner 440 is preferably formed to a thickness of about 10 to 500 angstroms, although smaller or larger thicknesses than the specified range may be used. The nitrogen-containing liner 440 is preferably a high tensile stress conformal nitride, $Si_3N_4$, liner. The chemical vapor deposition process may use precursor gases such as ammonia and silane. The typical deposition temperature is between 550 and 900 degrees Celsius. A trench filing material, the gap filler 460, preferably silicon oxide, is filled into the trenches 425. The gap filler 460 may be a combination of trench filling materials, such as a combination of CVD silicon oxide and CVD poly-crystalline silicon. After deposition, the gap filler 460 is densified by either a pyrogenic oxidation anneal at a temperature of 800 degrees Celsius or a conventional annealing step in argon ambient at 1000 degree Celsius.

Figure 4C:
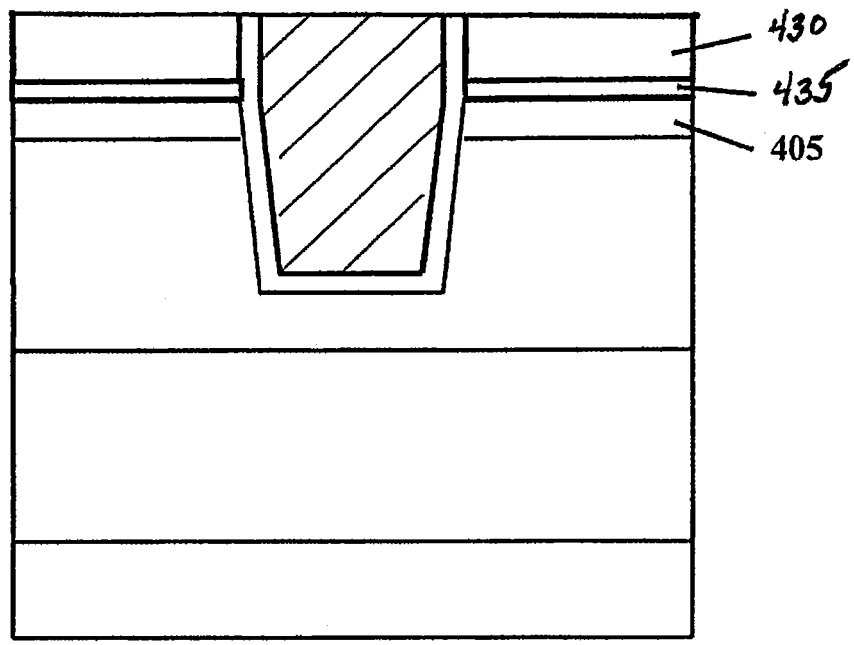
Figure 4D:
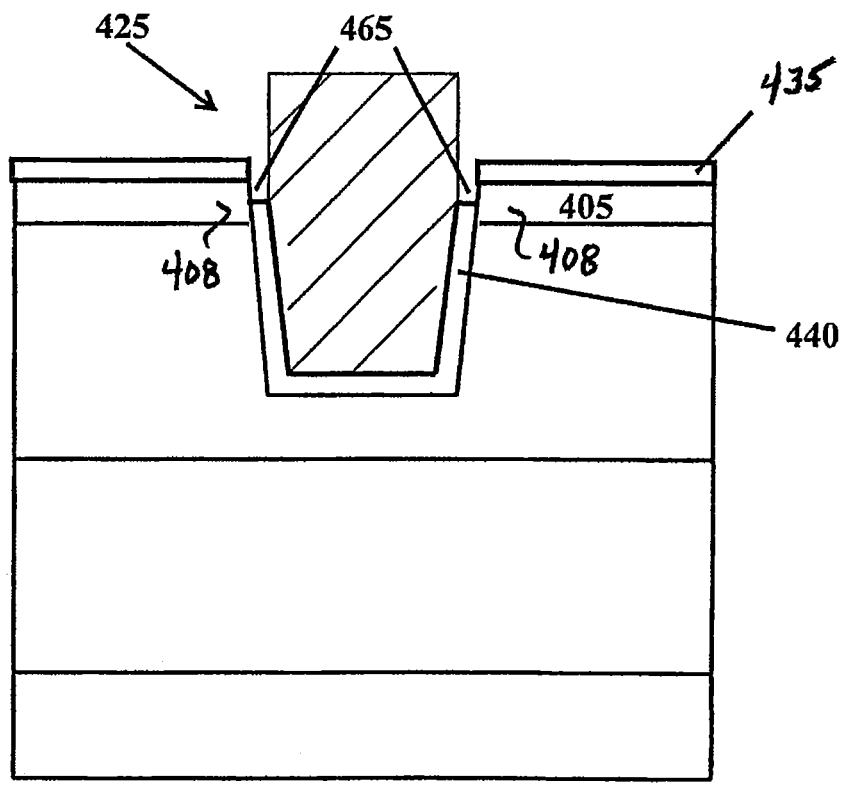
Figure 4E:
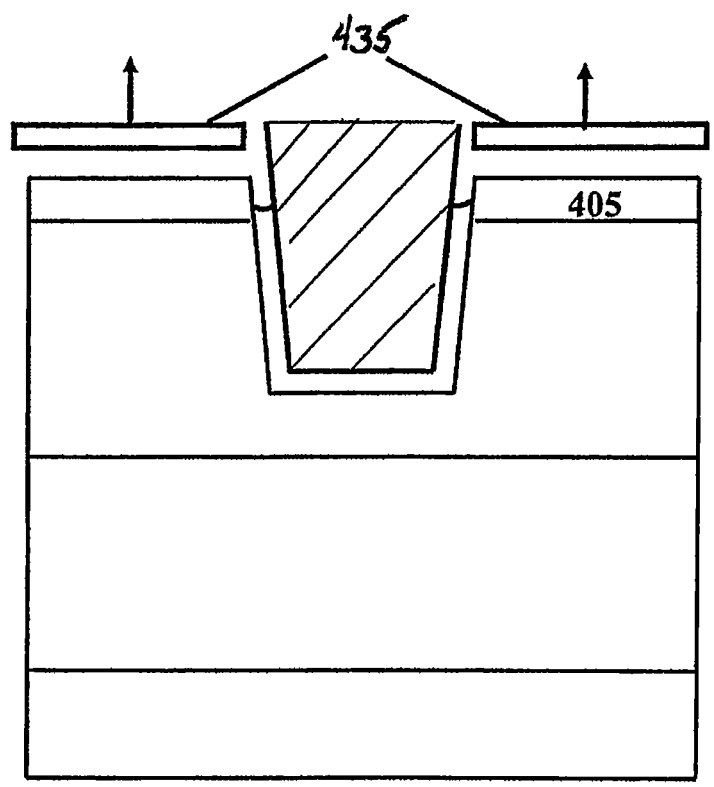
Figure 5A:
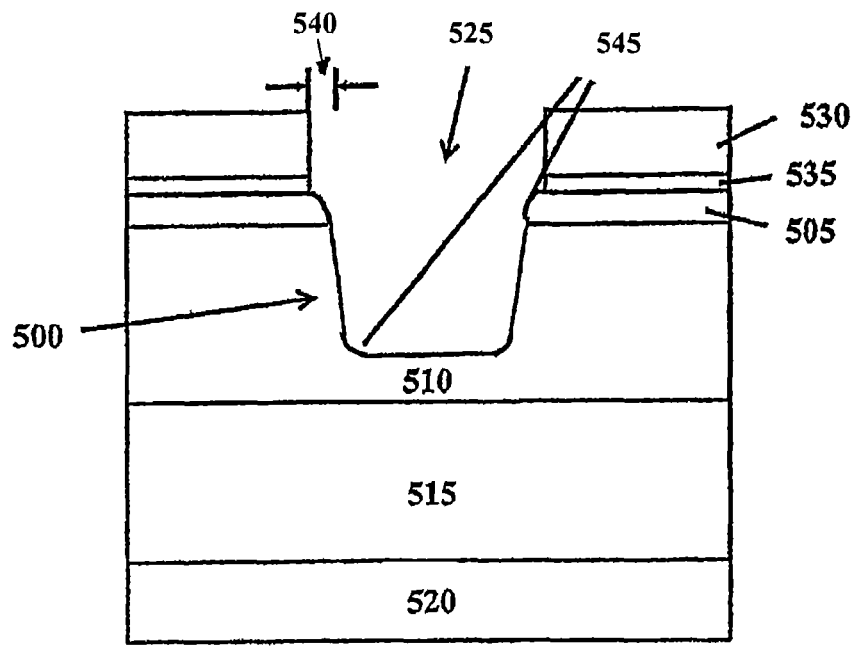
FIGS. 5(a)-(e) illustrate a second method of manufacturing a novel low-stress isolation structure for the strained silicon transistor according to another example of the present disclosure.
Figure 5B:
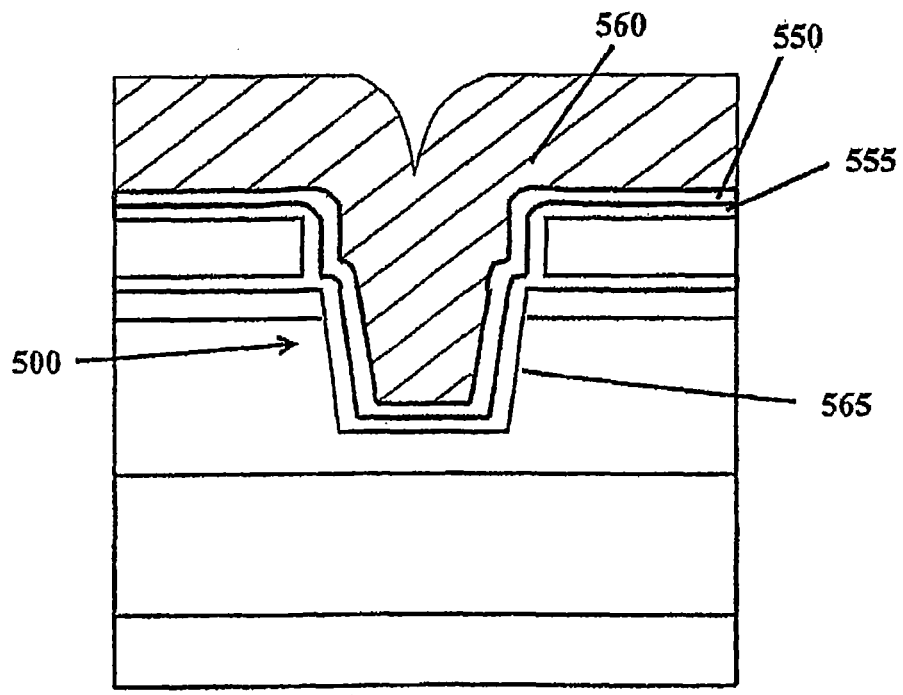
Figure 5C:
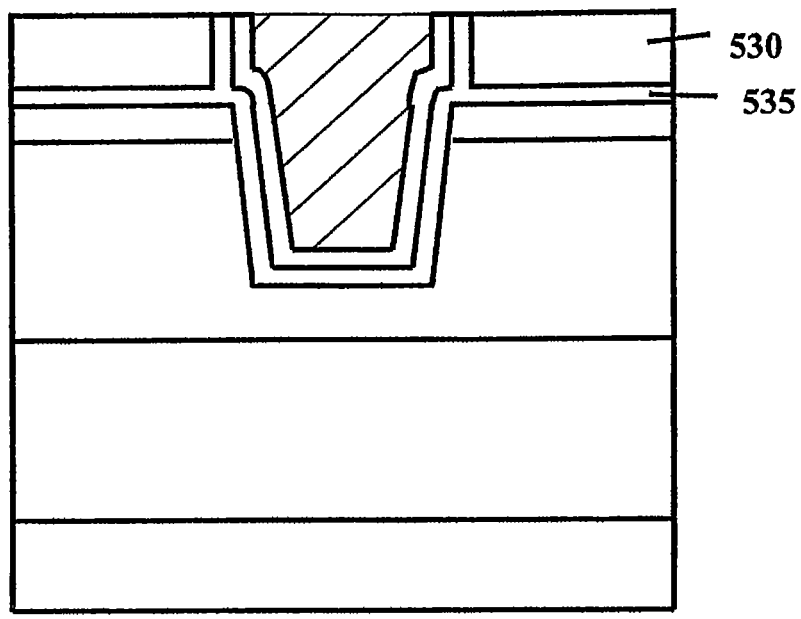
Figure 5D:
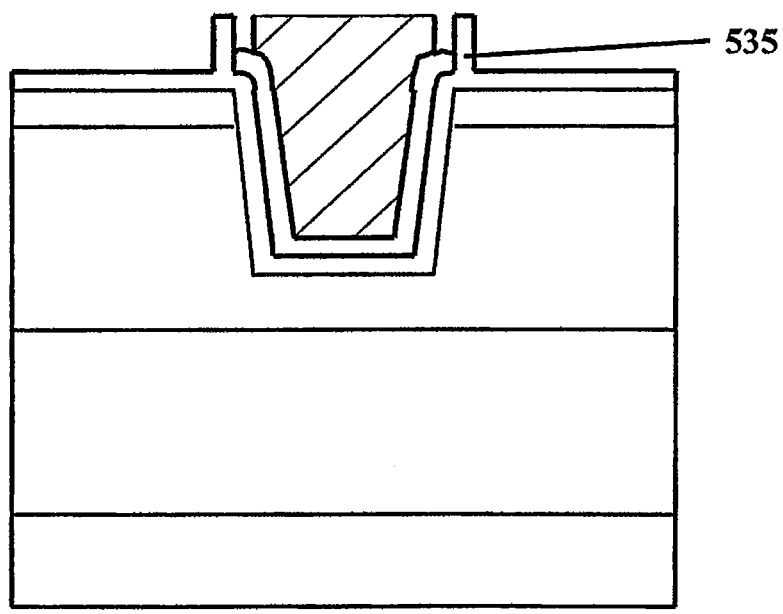
Figure 5E:
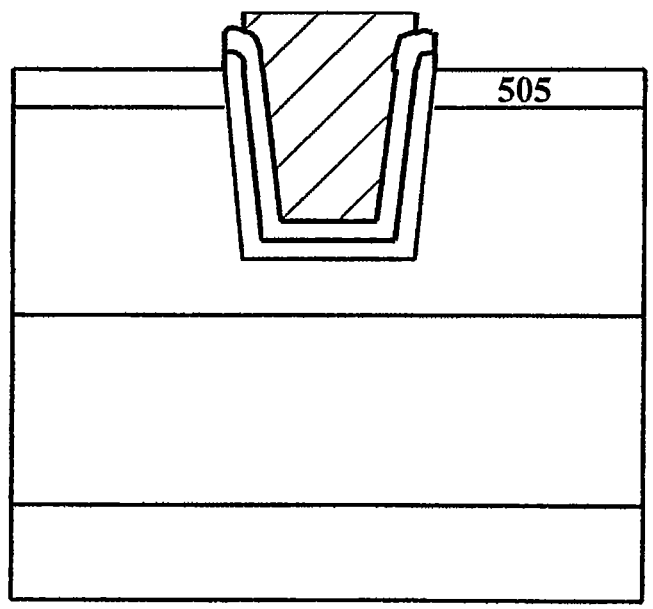
Figure 6A:
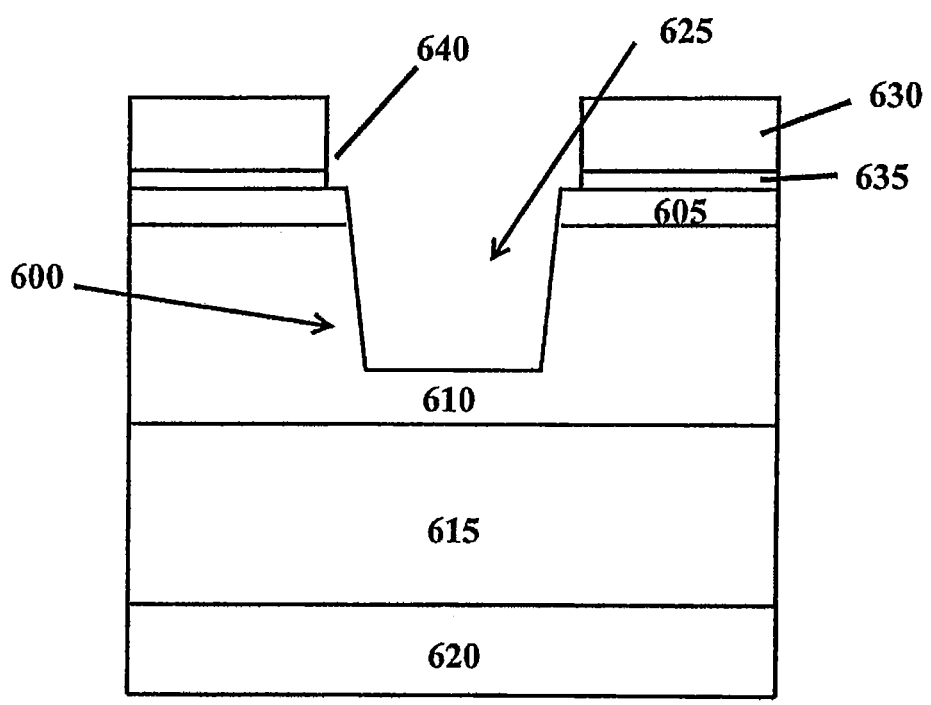
FIGS. 6(a)-(e) illustrate a third method of manufacturing a novel low-stress isolation structure for the strained silicon transistor according to another example of the present disclosure.
Figure 6B:
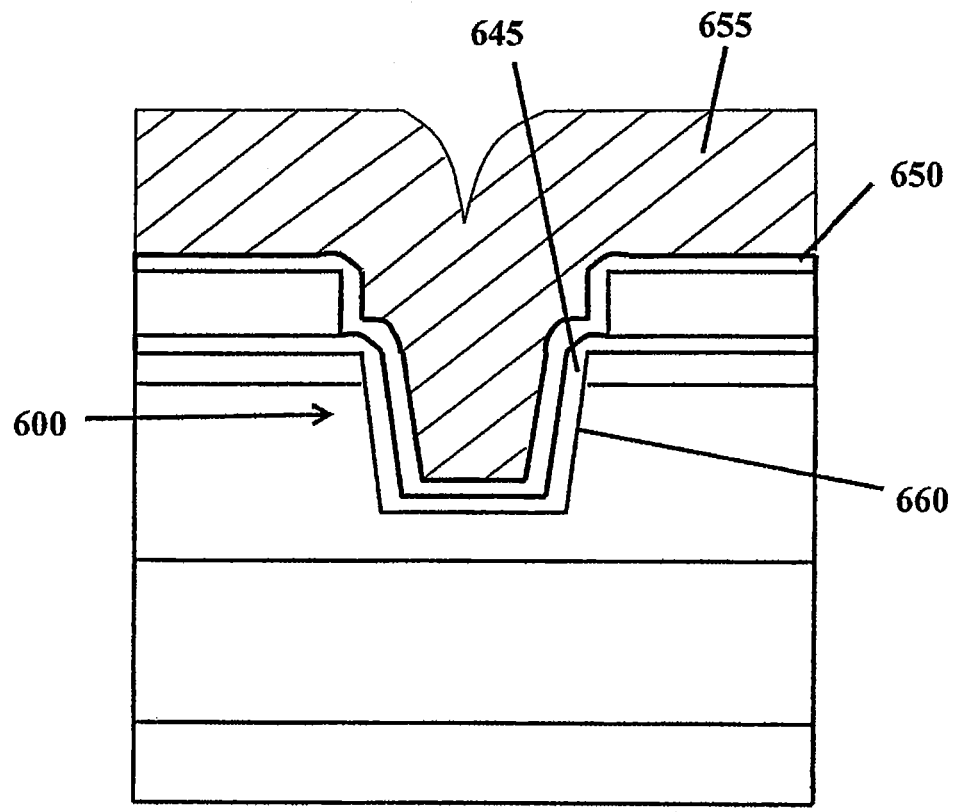
Figure 6C:
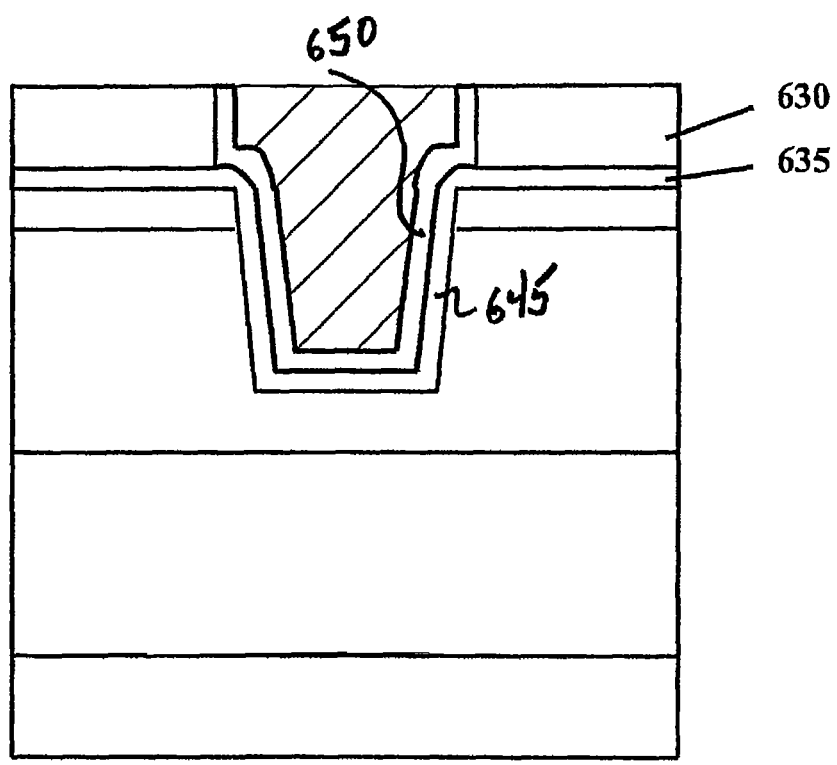
Figure 6D:
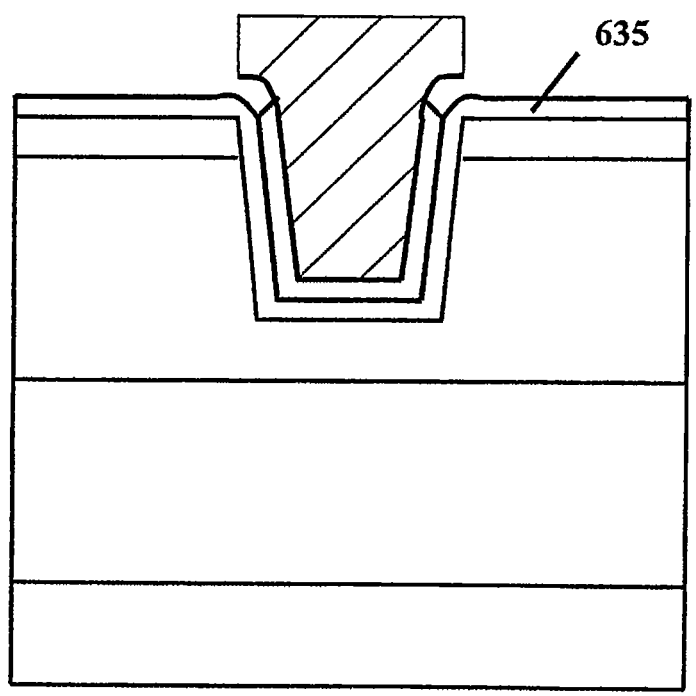
Figure 6E:
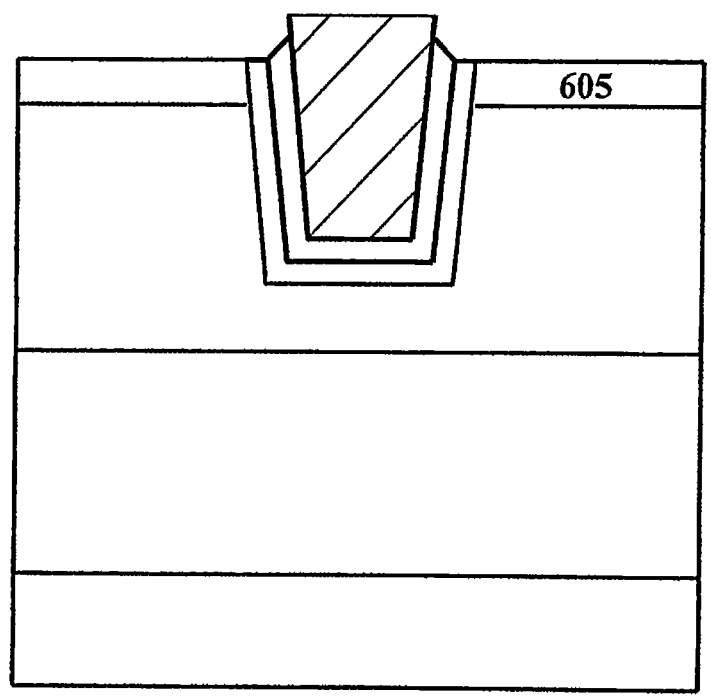

The cross-section in FIG. 4(c) illustrates the chemical mechanical polishing step performed to planarize the surface of the wafer. The first patterned mask can be removed. In the preferred embodiment, the first patterned mask comprises a silicon nitride or pad nitride 430 on a silicon oxide stack or pad oxide 435. The cross-section in FIG. 4(d) illustrates the removal of the first patterned mask by an etch in hot phosphoric acid followed by an etch in dilute hydrofluoric acid. It thus exposes the nitrogen-containing liner 440 through two recesses 465. The strained Si areas 408 on both sides of the trench are now covered by the pad oxide 435. Although not shown, if there are materials between the relaxed Si and the pad oxide layer 435, they can also be removed.

The cross-section in FIG. 4(*e*) illustrates the stripping of the pad oxide 435 by aqueous HF. Transistors may then be formed in the active regions with a surface comprising the strained silicon layer 405.

Fourth Embodiment

FIGS. 5(*a*)-(*e*) illustrate a second method embodiment of the present disclosure, describing a process flow for forming strained silicon transistors with reduced thermal budget and compressive strain contribution by the isolation structure to the channel region. The isolation structure 500 preferably comprises a nitrogen-containing liner 550 overlying a silicon oxide liner 555. In this method embodiment, the silicon oxide liner 555 is formed by chemical vapor deposition, preferably plasma-enhanced chemical vapor deposition (PECVD). The silicon oxide liner 555 is in direct contact with the trench sidewall surface 565. A substrate comprising a strained silicon layer 505 overlying a relaxed silicon-germanium (SiGe) layer 510 is used as the starting material. The starting substrate may further comprise a silicon substrate 520 underlying a graded SiGe buffer layer 515. A first patterned mask is formed on the substrate, and trenches 525 are etched into the substrate, as illustrated in FIG. 5(*a*). The first patterned mask is preferably comprised of a silicon nitride layer 530 overlying a pad oxide layer 535. The pad oxide layer 535 is preferably comprised of silicon oxide. A conventional anisotropic plasma etching with fluorine chemistry is used to etch the isolation trenches 525. Following the formation of the trenches 525, the wafer may be subject to a chemical treatment to result in a pull back of the first patterned mask. The pull back distance 540, as illustrated in FIG. 5(*a*), may be in the range of 50 to 1000 angstroms. The chemical treatment may be a wet etch process in hot phosphoric acid at a temperature in the range of 150 to 180 degrees Celsius. The chemical treatment may further comprise a wet etch in dilute hydrochloric acid. A corner rounding process may be performed producing rounded corners 545. The rounded corners 545 may be convex rounded corners (top corners at the trench 525 edge) or concave rounded corners (bottom corners at the trench 525 bottom). The corner rounding process is preferably an annealing process at temperatures in the range of 700 to 950 degrees Celsius in a gaseous ambient. The gaseous ambient may be comprised of hydrogen, helium, neon, argon, xenon, or any combination thereof.

The cross-section illustrated in FIG. 5(*b*) involves the deposition of the silicon oxide liner 555, the deposition of the nitrogen-containing liner 550, and the deposition of the gap filler material 560. The gap filler material 560 is preferably silicon oxide.

A planarization step, preferably using a chemical mechanical polishing process, is performed. The resulting cross-section is illustrated in FIG. 5(*c*). The pad nitride 530 is then removed. The resulting cross-section is illustrated in FIG. 5(*d*). The pad oxide 535 is then removed. The resulting cross-section is illustrated in FIG. 5(*e*). Transistors may then be formed in the active regions with a surface comprising the strained silicon layer 505.

Fifth Embodiment

FIGS. 6(*a*)-(*e*) illustrate a third method embodiment of the present disclosure, describing a process flow for forming strained silicon transistors with reduced thermal budget and compressive strain contribution by the isolation structure to the channel region. The isolation structure 600 comprises a nitrogen-containing liner 650 overlying a silicon oxide liner 645. The third method embodiment differs from the second method embodiment of the present disclosure in that the silicon oxide liner 645 of the third method embodiment is formed by a thermal oxidation process. The thermally grown silicon oxide liner 645 is in direct contact with the trench sidewall surface 660. Since the growth of the thermal oxide results in rounded corners, the corner rounding process is optional. A substrate comprising a strained silicon layer 605 overlying a relaxed silicon-germanium (SiGe) layer 610 is used as the starting material. A first patterned mask is formed on the substrate, and trenches 625 are etched into the substrate, as illustrated in FIG. 6(*a*). The first patterned mask is preferably comprised of a silicon nitride layer 630 overlying a pad oxide layer 635. The pad oxide layer 635 is preferably comprised of silicon oxide. A conventional anistropic plasma etching with fluorine chemistry is used to etch the isolation trenches 625. Following the formation of the trenches 625, the wafer may be subject to a chemical treatment resulting in a pull back of the first patterned mask. The pull back distance 640, as indicated in FIG. 6(*a*), may be in the range of 50 to 1000 angstroms. The chemical treatment may be a wet etch process in hot phosphoric acid at a temperature in the range of 150 to 180 degrees Celsius. The chemical treatment may further comprise a wet etch in dilute hydrochloric acid. A corner rounding process as previously described may optionally be performed.

The cross-section illustrated in FIG. 6(*b*) involves the thermal growth of a silicon oxide liner 645, the deposition of the nitrogen-containing liner 650, and the deposition of the gap filler material 655. The gap filler material 655 is preferably silicon oxide.

A planarization step, preferably using a chemical mechanical polishing process, is performed. The resulting cross-section is illustrated in FIG. 6(*c*). The pad nitride 630 is then removed. The resulting cross-section is illustrated in FIG. 6(*d*). The pad oxide 635 is then removed. The resulting cross-section is illustrated in FIG. 6(*e*). Transistors may then be formed in the active regions with a surface comprising the strained silicon layer 605.

The above disclosure provides many different embodiments, or examples, for implementing different features of the present disclosure. Specific examples of components, and processes are described to help clarify the present disclosure. These are, of course, merely examples and are not intended to limit the present disclosure from that described in the claims. For example, while a shallow trench isolation is illustrated, it is understood that the present disclosure may be extended to other isolation structures, which are improvements of the shallow trench isolation structure. Accordingly, the specification and figures are to be regarded in an illustrative rather than a restrictive sense.

While the present disclosure has been particularly shown and described with reference to the preferred embodiment thereof, it will be understood by those skilled in the art that various changes in form and detail may be made therein without departing from the spirit and scope of the present disclosure, as set forth in the following claims.

The invention claimed is:

1. A method for forming an isolation structure for strained channel transistors comprising:
    forming a pattern mask over a semiconductor substrate, the semiconductor substrate comprising an oxide layer on a strained silicon layer on a silicon-germanium (SiGe)

layer; forming a trench in the semiconductor substrate through the pattern mask and through the oxide layer and the strained silicon layer, and partially through the SiGe layer, the trench having sidewall surfaces and a bottom surface between a bottom surface of the SiGe layer and a top surface of the SiGe layer;

forming a single nitrogen-containing liner of a single liner material in the trench in direct contact with the trench sidewall surfaces from a bottom surface of the trench within the SiGe layer, through the strained silicon layer to a top of the oxide layer, wherein the nitrogen-containing liner is formed under tensile stress to induce a vertical compressive strain on the strained silicon;

filling the trench with a gap filler material, and removing a top portion of the single nitrogen-containing liner so that a topmost remaining exposed surface of the single nitrogen-containing liner is above a bottom surface of the strained silicon layer and below a top surface of the strained silicon layer.

2. The method according to claim 1, wherein the trench is formed by an anisotropic plasma etching with fluorine chemistry.

3. The method according to claim 2, wherein a surface of the gap filler material is higher than two ends of the liner in the trench.

4. The method according to claim 1, wherein the nitrogen-containing liner is comprised of silicon nitride or silicon oxynitride.

5. The method according to claim 1, wherein the nitrogen-containing liner has a nitrogen content of 5 to 60 percent (%).

6. The method according to claim 1, wherein the nitrogen-containing liner has a thickness in the range of 10 to 500 angstroms.

7. The method according to claim 1, wherein the nitrogen-containing liner is formed by a low-pressure chemical vapor deposition (LPCVD).

8. The method according to claim 7, wherein the low-pressure chemical vapor deposition (LPCVD) uses precursor gases such as ammonia or silane.

9. The method according to claim 7, wherein the low-pressure chemical vapor deposition (LPCVD) operates at a temperature between 500 and 900 degrees Celsius.

10. The method according to claim 1, wherein the nitrogen-containing liner is a high tensile stress conformal nitride liner.

11. The method according to claim 1, wherein the gap filler material is at least one of silicon oxide, CVD silicon oxide, or CVD poly-crystalline silicon.

12. The method according to claim 1, further comprising, after filling the trench with the gap filler material, densifying the gap filler material by either a pyrogenic oxidation anneal or a conventional anneal process.

13. The method according to claim 12, wherein the pyrogenic oxidation anneal process is conducted at a temperature of 800 degrees Celsius.

14. The method according to claim 1, wherein the patterned mask comprises a silicon nitride layer overlying a pad oxide layer.

15. The method according to claim 1, further comprising, after filling the trench with the gap filler material, planarizing the trench to remove a portion of the gap filler material.

16. The method according to claim 15, further comprising removing the pattern mask.

17. The method of claim 16, wherein the step of removing a top portion of the single nitrogen-containing liner is performed while removing the pattern mask, and the step of removing a top portion of the single nitrogen-containing liner includes exposing the topmost exposed surface of the single nitrogen-containing liner through a recess extending through the oxide layer and extending only partially through the strained silicon layer.

18. The method of claim 17, wherein the pattern mask and the top portion of the single nitrogen-containing liner are both removed by etching with phosphoric acid, followed by etching with hydrofluoric acid.

19. The method according to claim 18, wherein following removal of the pattern mask and the top portion of the single nitrogen-containing liner, a surface of the gap filler material directly overlying the bottom surface of the trench is higher than two ends of the liner in the trench.

20. The method of claim 1, wherein the step of removing a top portion of the single nitrogen-containing liner includes exposing the topmost exposed surface of the single nitrogen-containing liner through a recess extending through the oxide layer and extending only partially through the strained silicon layer.

* * * * *